United States Patent [19]

Bohner et al.

[11] Patent Number: 5,201,041
[45] Date of Patent: Apr. 6, 1993

[54] CACHE BYPASS APPARATUS

[75] Inventors: James E. Bohner; Thang T. Do, both of Endwell; Richard J. Gusefski; Kevin C. Huang, both of Endicott; Chon I. Lei, Endwell, all of N.Y.

[73] Assignee: International Business Machines Corporation, Armonk, N.Y.

[21] Appl. No.: 662,339

[22] Filed: Feb. 25, 1991

Related U.S. Application Data

[63] Continuation of Ser. No. 291,888, Dec. 29, 1988, abandoned.

[51] Int. Cl.$^5$ .............. G06F 9/00; G06F 13/00
[52] U.S. Cl. .................. 395/425; 364/964.2; 364/243.4
[58] Field of Search ............... 364/DIG. I, DIG. II; 395/425

[56] References Cited

U.S. PATENT DOCUMENTS

| | | | |
|---|---|---|---|
| 4,075,686 | 2/1978 | Calle et al. | 364/200 |
| 4,268,907 | 5/1981 | Porter et al. | 364/200 |
| 4,442,487 | 4/1984 | Fletcher et al. | 364/200 |
| 4,502,110 | 2/1985 | Saito | 364/200 |
| 4,551,799 | 11/1985 | Ryan et al. | 364/200 |
| 4,685,082 | 8/1987 | Cheung | 364/200 |

Primary Examiner—David Y. Eng
Attorney, Agent, or Firm—Pryor A. Garnett; Arthur J. Samodovitz; David S. Romney

[57] ABSTRACT

An inpage buffer is used between a cache and slower storage device. When a processor requests data, the cache is checked to see if the data is already in the cache. If not, a request for the data is sent to the slower storage device. The buffer receives the data from the slower storage device and provides the data to the processor that requested the data. The buffer then provides the data to the cache for storage provided that the cache is not working on a separate storage request from the processor. The data will be written into the cache from the buffer when the cache is free from such requests. The buffer is also able to provide data corresponding to subsequent requests provided it contains such data. This may happen if a request for the same data occurs, and the buffer has not yet written the data into the cache. It can also occur if the areas of the cache which can hold data from an area of the slower storage is inoperable for some reason. The buffer acts as a minicache when such a catastrophic error in the cache occurs.

6 Claims, 10 Drawing Sheets

| | SLOT 0 | SLOT 1 | SLOT 2 | SLOT 3 |
|---|---|---|---|---|
| | PAGE 0 | PAGE 0 | PAGE 0 | PAGE 0 |
| | PAGE 1 | PAGE 1 | PAGE 1 | PAGE 1 |
| | PAGE 2 | PAGE 2 | PAGE 2 | PAGE 2 |
| | PAGE 3 | PAGE 3 | PAGE 3 | PAGE 3 |
| | : | : | : | : |
| | PAGE 62 | PAGE 62 | PAGE 62 | PAGE 62 |
| | PAGE 63 | PAGE 63 | PAGE 63 | PAGE 63 |

| |
|---|
| DOUBLE WORD 0 |
| DOUBLE WORD 1 |
| DOUBLE WORD 2 |
| DOUBLE WORD 3 |
| DOUBLE WORD 4 |
| DOUBLE WORD 5 |
| DOUBLE WORD 6 |
| DOUBLE WORD 7 |

| | SLOT 0 | | | SLOT 1 | | | SLOT 2 | | | SLOT 3 | | |
|---|---|---|---|---|---|---|---|---|---|---|---|---|
| CONGRUENCE CLASS 0 | AA 4-19 | I | B | AA 4-19 | I | B | AA 4-19 | I | B | AA 4-19 | I | B |
| CONGRUENCE CLASS 1 | AA 4-19 | I | B | AA 4-19 | I | B | AA 4-19 | I | B | AA 4-19 | I | B |
| CONGRUENCE CLASS 2 | AA 4-19 | I | B | AA 4-19 | I | B | AA 4-19 | I | B | AA 4-19 | I | B |
| CONGRUENCE CLASS 3 | AA 4-19 | I | B | AA 4-19 | I | B | AA 4-19 | I | B | AA 4-19 | I | B |
| CONGRUENCE CLASS 4 | AA 4-19 | I | B | AA 4-19 | I | B | AA 4-19 | I | B | AA 4-19 | I | B |
| CONGRUENCE CLASS 5 | .. | .. | .. | .. | .. | .. | .. | .. | .. | .. | .. | .. |
| .. | .. | .. | .. | .. | .. | .. | .. | .. | .. | .. | .. | .. |
| CONGRUENCE CLASS 62 | AA 4-19 | I | B | AA 4-19 | I | B | AA 4-19 | I | B | AA 4-19 | I | B |
| CONGRUENCE CLASS 63 | AA 4-19 | I | B | AA 4-19 | I | B | AA 4-19 | I | B | AA 4-19 | I | B |

FIG. 3

CACHE BYPASS APPARATUS

This application is a continuation of application Ser. No. 07/291,888, filed Dec. 29, 1988, now abandoned.

INCORPORATION BY REFERENCE

Copending patent application for "A Store Buffer Apparatus In A Multiprocessor Computer System", Serial No. 291,805 filed on the same date herewith, now abandoned, which is the parent of application Ser. No. 07/725,919, to the same assignee as the present application, and hereby incorporated by reference.

Another related copending application assigned to the same assignee as the present application is entitled "Interruptible Cache Loading" filed Aug. 24, 1987, Ser. No. 88,753, now abandoned, which is the parent of application Ser. No. 07/829,609.

BACKGROUND OF THE INVENTION

The present invention relates to buffering data between a cache and a slower storage, and in particular to the provision of data from the buffer directly to the host.

Storage caches have long been used to provide data to a processor very quickly. The speed at which data is provided, and the cost of the cache seem to go up together, so it is expensive to provide a large cache. The cache is usually provided between a slower random access memory such as a large main storage, and the processor. In some prior art systems, a small buffer has been provided between the cache and main storage. The buffer has been used to provide the data to the processor at the same time that it is being written into the cache as in U.S. Pat. Nos. 4,189,770 and 3,820,078. In this manner, the processor does not have to wait for the data to be written into the cache. This approach has the disadvantage that the cache can not be working on a further storage request until the data from the buffer has been written into the cache.

Other problems associated with caches include portions of the cache becoming inoperable. If a portion of the cache which corresponds to a range of storage in main storage is bad, the cache becomes worthless for that range of storage. In such a case, the section of cache is deleted from use as in U.S. Pat. Nos. 3,800,292; 4,464,717; 3,820,078 and IBM TDB Vol. 23, No. 9 dated February 1981 titled "Cache Reconfiguration." In the IBM TDB, spare portions of the cache can be mapped to replace failed portions. However, once there are no spare portions available, the cache can not be used.

SUMMARY OF THE INVENTION

A buffer is used between a cache and slower storage device. When a processor requests data, the cache is checked to see if the data is already in the cache. If not, a request for the data is sent to the slower storage device. The buffer receives the data from the slower storage device and provides the data to the processor that requested the data. The buffer then provides the data to the cache for storage provided that the cache is not working on a separate storage request from the processor. The data will be written into the cache from the buffer when the cache is free from such requests.

The buffer is also able to provide data corresponding to subsequent requests provided it contains such data. This may happen if a request for the same data occurs, and the buffer has not yet written the data into the cache. It can also occur if the areas of the cache which can hold data from an area of the slower storage is inoperable for some reason. In this manner, the buffer acts as a minicache.

The present invention has several advantages over the prior art. First, since the data received by the buffer from the slower storage does not need to be written into the cache immediately, the cache is free to service other read or write requests from the processor. When the cache is free of such other requests, then the data is written into the cache. This leaves the cache free to provide optimal service to the processor.

The buffer also acts as a separate minicache for the data that has not yet been written into the cache. In one preferred embodiment, the buffer is large enough to hold an entire page of data. After supplying the requested data, the buffer contains an entire page of data from the slower storage that it is waiting to write into the cache. During this time, further pending requests are satisfied both from the cache and the buffer. The writing of the data is delayed, but the latest, most recently used page of data is still available from the buffer. It is probably the most likely page which contains further data requested.

A further benefit of the invention results when errors occur in reading data from the cache. A cache directory keeps track of portions of the cache that are not supplying valid data. If all portions of the cache corresponding to a portion of the slower storage are inoperable, then the buffer provides a similar cache like performance for that portion. The only impact on the system is that the buffer is smaller than the cache portions in the preferred embodiment and hence does not meet the performance provided by a fully operational cache. It still provides valuable 'normal' operation until the cache is repaired.

Further benefits will become apparent upon reading the following detailed description.

BRIEF DESCRIPTION OF THE FIGURES

FIG. 3 is a representation of the logical layout of the data directory for the data cache of FIG. 2.

DETAILED DESCRIPTION

Figure 1:
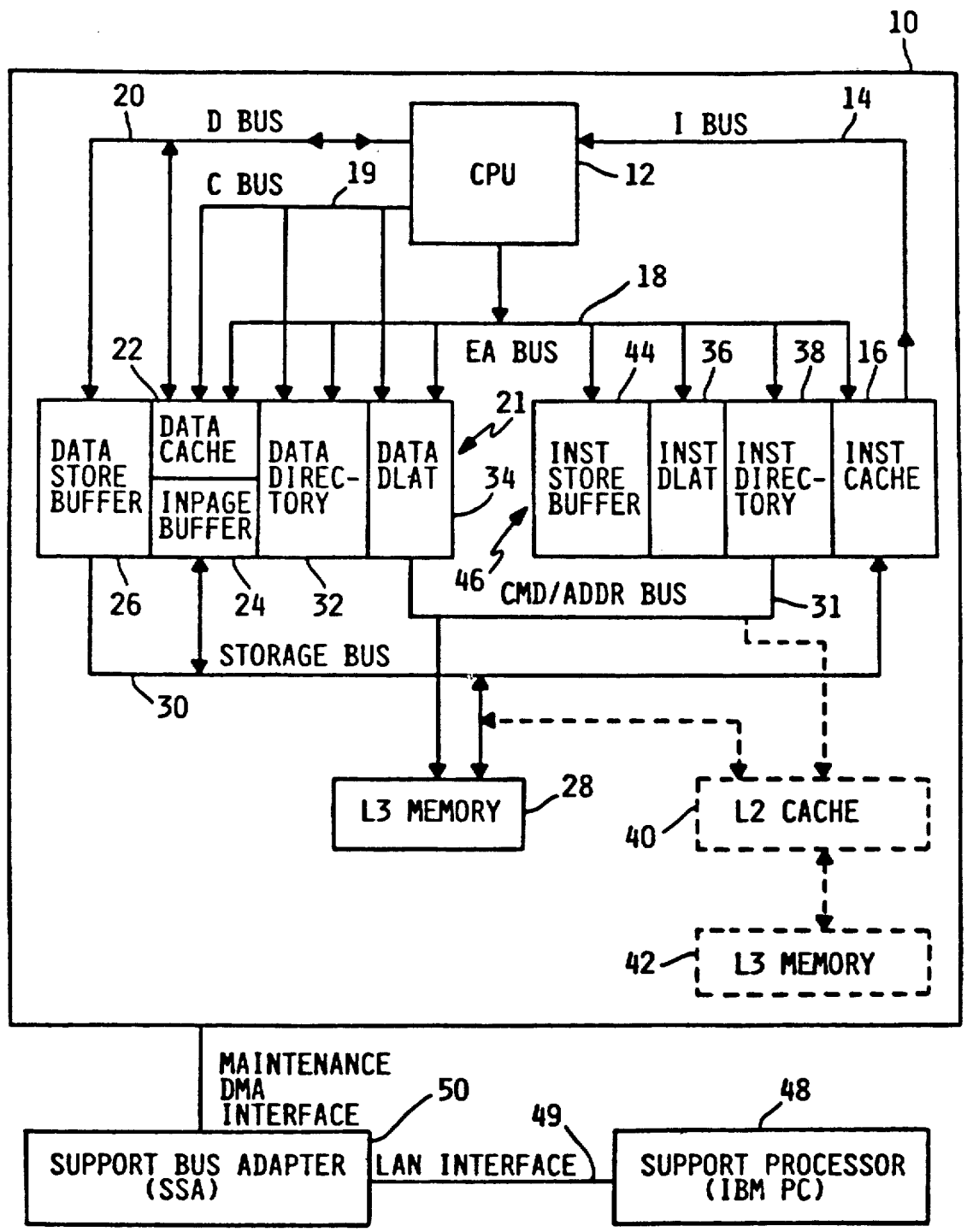
FIG. 1 is a block diagram of a multi-level storage subsystem incorporating a buffer in accordance with the present invention.

In FIG. 1, a multi-level storage hierarchy system is shown generally at 10. A central processor, CPU 12 sends and receives data, addresses and instructions over a plurality of buses. I bus 14 is used to transfer instructions between an instruction cache 16 and processor 12. An effective address, EA bus 18 is used to communicate addresses for instructions and data. A command bus, C bus 19 is used to communicate storage commands to the date cache unit comprising the elements indicated generally at 21. A data bus, D bus 20 is coupled to a data cache 22, a buffer 24 and a data store buffer 26. Data store buffer 26, inpage buffer 24 and instruction cache 16 are all coupled to a memory 28 via a storage bus 30. A command/address bus, cmd/addr bus 31 is used to communicate to the memory 28 from look aside translator 34 and instruction look aside translator 38.

Memory 28 in a uniprocessor implementation corresponds to a typical main storage, which is quite a bit slower than memories used for caches. Data and instruction in the caches provide data and instruction to processor 12 much quicker provided that the information is in the caches. This is determined for the data cache 22 by a data directory 32 and look aside translator 34. An instruction directory 36 and instruction look aside translator 38 make the determination for the instruction cache 16.

In a multiprocessor implementation, a second cache 40 is provided which is shared by similarly configured processors. The second cache is in turn coupled to a larger shared main storage 42. The interface between storage 28 or cache 40 via storage bus 30 is very much the same, and will be described later.

In operation, processor 12 fetches instructions from the instruction cache 16. The instruction is delivered to the processor 12 through the I bus 14. After decoding the instruction, the processor 12 sends a storage command to the data cache unit 21 via C bus 19. At the same time, the processor 12 sends out the storage address to the data cache unit 21 through the EA bus 18. Upon receiving the storage command and address, the data cache unit 21 searches through the look aside translator 34 and data directory 32 to determine if the requested data is in the data cache 22. If there is a cache hit, the data, which is commonly referred to as an operand (instructions operate on operands) is sent back to the processor 12 through the D bus 20. For a cache miss, the data will be obtained from either main storage 28 or second level cache 40. In further description, references to main storage 28 should be interpreted to mean either main storage 28 or second level cache 40 in conjunction with memory 42.

In one embodiment, a line of data, also referred to as a page, of 64 bytes is sent back to the data cache unit 21 from memory 28 via the storage bus 30. A page of data is transferred in the preferred embodiment because the next data to be requested is probably contained on the same page. It takes eight transfers to complete the inpage of data. The first transfer contains the doubleword (8, 8 bit bytes) that the processor 12 requested. As soon as the data cache unit 21 receives the first transfer of data, it sends the data back to the processor 12 through the D bus 20, and at the same time, the data is written into the buffer 24 also called inpage buffer 24. In fact, the rest of the inpage data is written into the inpage buffer 24 first. As soon as the processor 12 receives the data, it starts to send the next storage command to the data cache unit 21. The data cache unit 21 will process the next storage request because the cache 22 is not tied up for the inpage. The data from the inpage buffer 24 is stored back into the cache 22 only when there are no more storage requests for the data cache unit 21 to process.

In the case of a store operation, the processor 12 sends the data to be stored to the data cache unit 21 through the D bus 20. Again, the data directory 32 and translator 34 search for a cache hit or miss. If the page is in the cache, then the data is stored into the cache 22 and the store buffer 26. If it is a cache miss, then the store data is only stored into the store buffer 26. In either event, the data is written out to storage 28 from store buffer 26 as long as storage bus 30 is free. That means the storage bus 30 is not tied up for either data or instruction cache inpage operation.

When a store operation is initiated, the store address is also stored into a store buffer 44 associated with the instruction cache unit indicated generally at 46. This is used to interlock with all subsequent instructions fetched after the store operation. If there is an equal compare of instruction fetch address and the store address in the store buffer 44, the instruction in the instruction cache 16 has been modified. The instruction is then disregarded, and the new instruction is fetched from memory 28.

As with the data cache unit 21, the instruction translator 38 and directory 36 are searched in parallel for a hit or miss in instruction cache 16. If it is a cache hit, then the instruction is delivered to the processor 12 through instruction bus 14. If it is a cache miss, then an inpage from memory 28 occurs. 64 bytes of instructions will be inpaged to the instruction cache 16 through the storage bus 30. The first transfer of the inpage contains the instruction that the processor 12 requested. The instruction is then sequentially delivered to the processor 12.

Figures 2, 4:
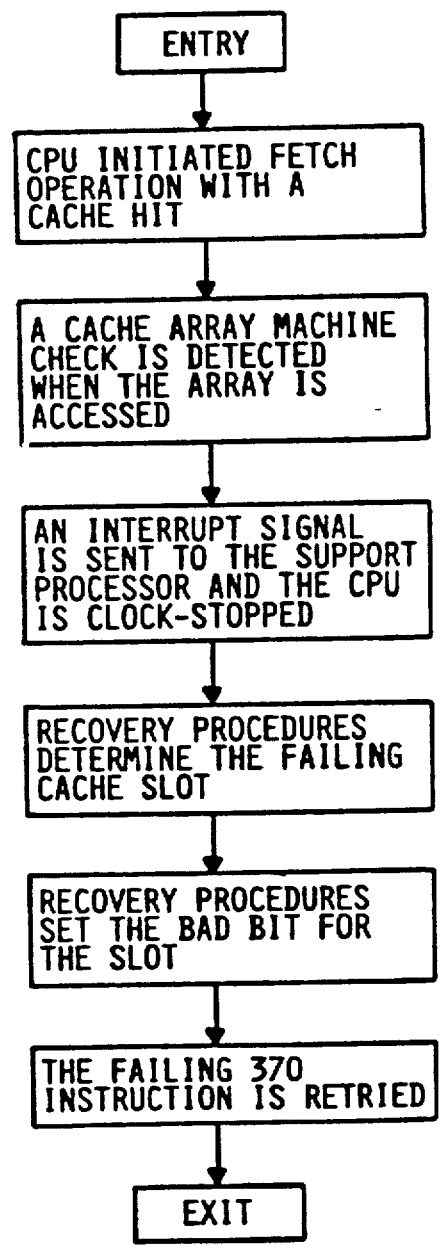
FIG. 2 is a representation of the logical layout of a data cache in the subsystem of FIG. 1.
FIG. 4 is a block flow diagram showing the setting of a bad bit in the data directory of FIG. 3.

Data cache 22 and instruction cache 16 are identical in one embodiment, and their logical layout is shown in FIG. 2. The data cache 22 consists of 16K bytes of data. The instruction cache 16 also consists of 16K bytes of instruction. They can be accessed simultaneously without any interference to each other. Each cache is partitioned into four slots with 64 pages per slot. Each page contains 64 bytes (eight doublewords) of data or instruction. In addition, data cache 22 also contains inpage buffer 24 to hold a complete page of 64 bytes, which is also referred to as a cache line.

Each cache is accessed through a corresponding directory. Data directory 32 corresponding to data cache 22 and instruction directory 36 corresponding to instruction cache 16. The directories are partitioned into four slots as indicated in FIG. 3. There are 64 congruence classes per slot. Each slot of each congruence class identifies the address of a page of data in the cache. The content of each slot in the directory for each congruence class includes absolute address bits..4 to 19. The translator (34 or 38) will map EA bus 18 bits 1 to 19 into absolute address bits 4 to 19. EA bus 18 bits 20 to 31 are always equal to absolute address bits 20 to 31. Explanation of how the translator (34 or 38) operation will be given later. Storage 28 is only addressed by absolute address bits 4 to 28. Absolute address bits 29 to 31 are not used to address storage 28 because storage 28 is addressed at 8 byte chunks. Since bit 4 of the absolute address is the most significant bit to address storage 28,the directory can support up to 256M bytes of storage 28. There are also four sets of status bits for each congruence class, with each set of two status bits associated to a corresponding slot. Each set of status bits includes an invalid (I) bit and bad (B) bit. The I bit indicates the validity of a cache line. It is only when the I bit of that line is off that data or instructions can be sent back to the processor 12. The B bit is used to indicate the useability of a cache line. If a B bit is set to one, it indicates that the circuitry that made up the physical location of that page is bad and that page, either in the cache or directory array is no longer useable.

All the B bits are initially set to off at power on time. Upon detection of a parity check in either the data cache or its directory, a hardware interrupt signals a support processor 48 in FIG. 1 of the failure. The support processor is coupled by a LAN 49; through a support bus adapter 50 to the System 10. A common DMA (direct memory access) connection is used between System 10 and adapter 50. Support processor 48 invokes recovery microcode to determine the affected cache line, and sets the B bit on for the failing cache line as seen in FIG. 4. Since the main storage always has the backup copy of a cache page, the loss of a cache line when marked 'BAD' does not affect the integrity of system operation. The system is able to continue operation by recovering the lost cache line data from main storage 28. A threshold is maintained in the support processor 48 to determine if an excessive number of cache lines are deleted. A deferred service call will be placed in such an event. All the I bits are also initially set to one at power on time. Upon the completion of writing the entire 64-byte page into the data cache unit 21, the corresponding cache page will have the I bit set to zero which indicates the cache page is valid.

Figure 5:
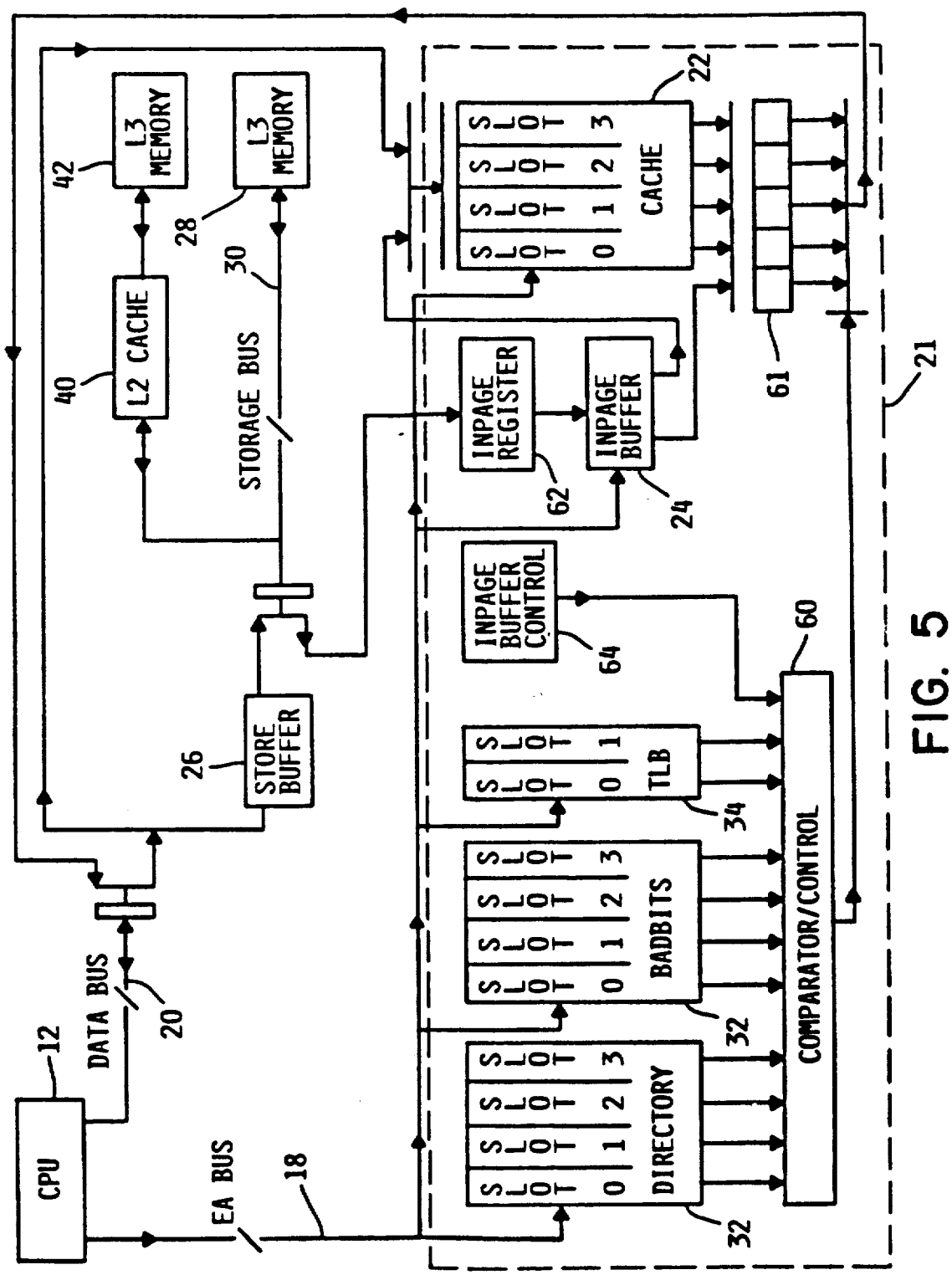
FIG. 5 is a block diagram of data flow associated with the cache and buffer of the subsystem of FIG. 1.

System dataflow is shown in further detail in FIG. 5, wherein the numbering is consistent with FIG. 1. When processor 12 initiates a fetch operation, the storage address is placed on EA bus 18. The EA bus 18 is 31 bits wide with address bits 1 to 31. As soon as the data cache unit 21 receives the address, bits 14 to 19 are used to address the translator 34; bits 20 to 25 are used to address the congruence class of the directory 32, and bits 20 to 28 are used to address the cache. Bits 29 through 31 identify the byte of the double word of the addressed 22 cache line. The access of the translator, directory and cache are all done in parallel. The outputs of the translator are used to compare with the address bits 1 to 13 of the EA bus 18 at a comparator 60. The translator 34 is designed with two way associative with 64 pages per associativity class. Each page of the translator 34 consists of 4K bytes of data. Whichever output of the two associativity classes has a match with address bits 1 to 13 of the EA bus, then its corresponding absolute address, bits 4-19, is used to compare with the contents (absolute address bits 4-19) in the four slots of the referenced congruence class from the directory 32. A slot hit is generated if one of the four sets addresses in the slots of the directory has a match with the absolute address from the translator 34. At the same time, all four slots of data (8 bytes per slot) from the cache output are latched up. The data for the matched slot is then selected at 61 to send back to processor 12 through data bus 20. A total of five machine cycles are used to update local storage in the processor 12 with the fetch data starting from an instruction decode as shown the timing diagram of FIG. 6.

Figure 6:
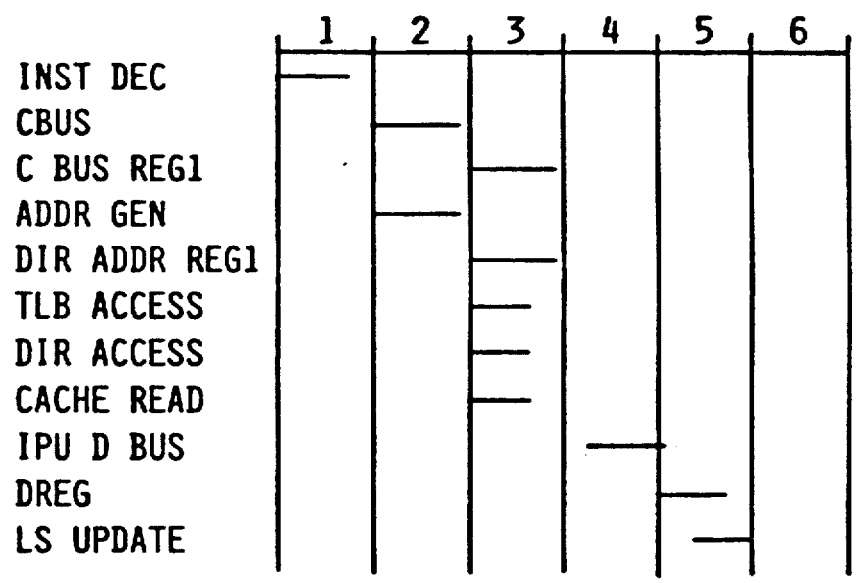
FIG. 6 is a timing diagram for a cache hit.

FIG. 6 is a timing chart for a cache hit, in other words, the data requested is in the cache. The activity performed is indicated in the left column of the chart, and the cycle number is indicated across the top of the chart. The processor 12 first decodes the instruction which identifies an operand or data in cycle 1. The storage command resulting from the instruction decode is placed on the C bus 19 during the second cycle, and then is latched up in C bus REG1 during cycle 3. The bus REG1 is located in the translator 34, directory 32 and cache 22. During cycle 2, the storage address is generated, and placed on the EA bus 18. During cycle 3, the translator 34, directory 32 and cache 22 are being accessed with the address. The data is then placed on the data bus 20 during the fourth cycle, and received and latched from a data register during cycle 5 by the processor 12.

CACHE MISS

For the case that the absolute address from the translator 34 does not match with any one slot from the referenced congruence class of the directory 32, or if there is a matched slot but either the I or B bit of the matched slot is on, then a cache miss is generated by comparator/controller 60. An inpage request comprising a starting address of the desired data is sent to storage 28 by translator 34 via the addr/CMD bus 31 to storage 28. Storage 28 includes appropriate control circuitry to control its access, and responds to the inpage request with a line or page of 64 bytes of data back to the data cache unit 21. Regardless of the actual page boundary in storage 28, the data requested is returned first, and the remainder of the page is sent, followed by the beginning of the page up to the data requested. The data cache unit 21 operates on a least recently used basis to determine which one of the four slots to store the cache line. Since the storage bus 30 between storage 28 and the data cache unit 21 is only 8 bytes wide, eight transfers, or cycles are needed in order to finish the inpage. The first transfer of data from the storage 28 to the data cache unit 21 always contains the data that the processor 12 requested. As soon as the data cache unit 21 receives the first transfer of data, it sends the data back to the processor 12 through the data bus 20.

Figure 7:
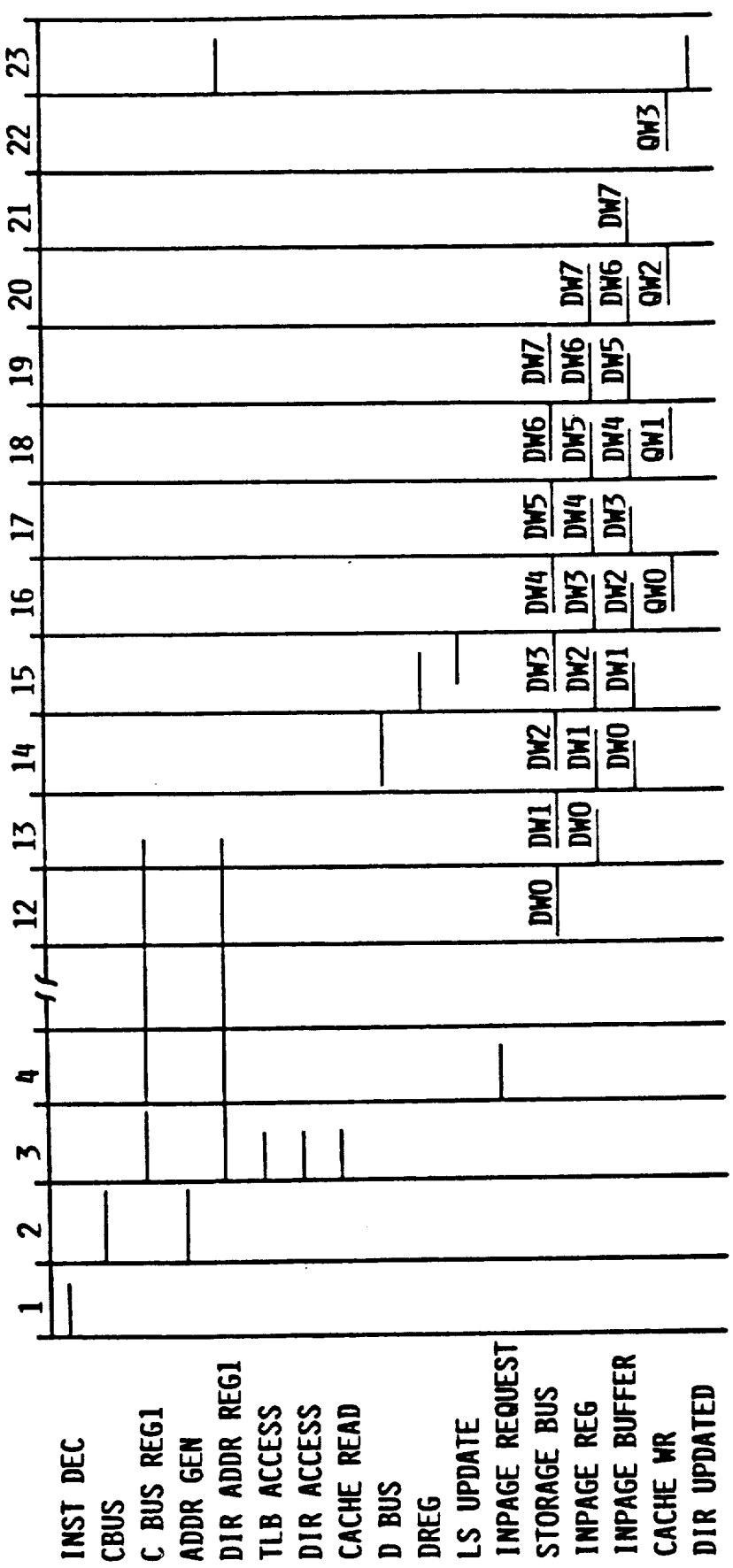
FIG. 7 is a timing diagram for a cache miss.

FIG. 7 illustrates the timing chart of a cache miss. The timing is similar to that in FIG. 6 until cycle 4. Instead of the data being placed on the data bus 20 in cycle 4, the inpage request is made. At cycle 12, the first 8 bytes, DWO, of data appears on the storage bus 30 from storage 28, followed by successive 8 byte chunks in successive cycles. At cycle 13, DWO is placed in an inpage register 62 in FIG. 5, and then in the inpage buffer 24 at cycle 14. At cycle 14, DWO is also placed on the data bus 20, and received by processor 12 as before. Quadwords (QW) are written back from inpage buffer 24 to the cache 22 one at a time.

After the 8 bytes of data are sent back to the processor 12, the data cache unit 21 can start to process the next storage request while the inpaging for the rest of the data is still going on. The cache 22 is made up by one port arrays. It can not store the inpage data and at the same time process the next storage request. Since all the inpage data is put into the inpage buffer 24 first, the data can remain there until there are no more storage requests, or the cache is not busy any more. Then the inpage data from the inpage buffer is stored back into the cache. Should there be another fetch request to the same page before the inpage data is stored back into the cache, the requested data is accessed from the inpage buffer and sent back to the processor immediately. An inpage buffer control block 64 contains the absolute address bits 4 to 28 of the data requested, and is used by comparator/controller 60 to determine the status and identity of data in the inpage buffer 24. The comparator/controller 60 compares the absolute address bits 4 to 28 from the inpage buffer control block 64 with the absolute address bits 4 to 19 from the selected translator 34 output and EA bus 18 bits 20 to 28 to determine whether the requested data is in the inpage buffer 24 or not. There is also an Invalid bit for the inpage buffer 24 in the inpage buffer control block 64. If all the data from the inpage buffer 24 have not been written back into the cache 22 yet, then the Invalid bit would be set to 0. After all the data has been written back to the cache 22 from the inpage buffer 24 then the Invalid bit would be reset to 1. It is only when the Invalid is 0, data from the inpage buffer 24 can be sent back to the processor 20. If the processor 12 request belongs to the same page which is still inpaging but not in the inpage buffer yet, then the processor waits until the data is put into the inpage buffer. The inpage buffer will then be selected by comparator/controller 60 to supply the requested data. Further detail of the inpage buffer, and its control are discussed with reference to FIG. 9 and FIG. 10 in a further section of this description. Finally, when all the data from the inpage buffer is stored back into the chosen slot of the cache, the directory 32 is updated with the absolute address from the translator 34. If the I bit of the updated slot is already zero, it will remain at zero. If the I bit is not already at zero, it is set to zero. Note that the LRU page replacement routine does not choose a slot that has the B bit equal to one.

Figure 8:
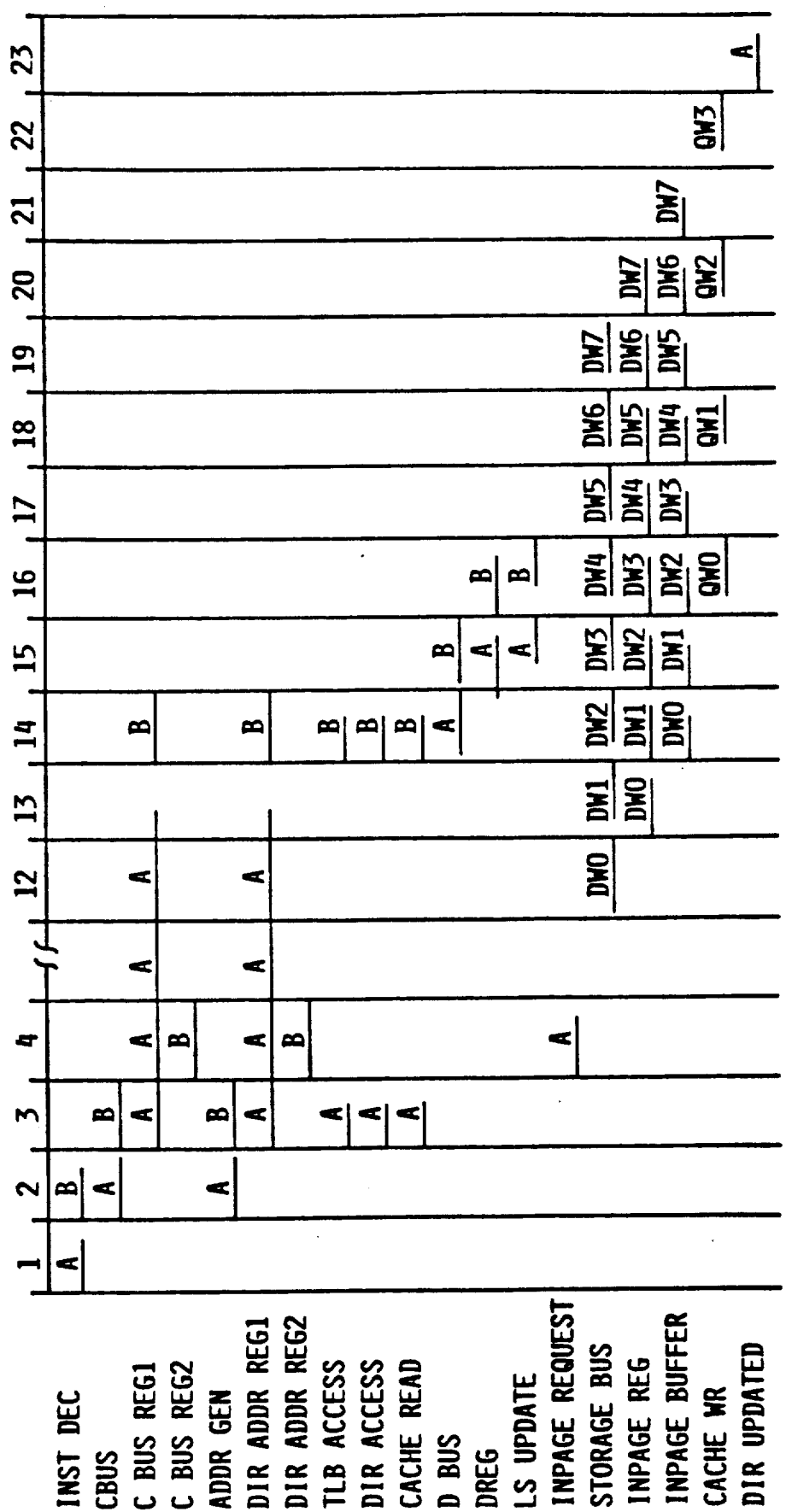
FIG. 8 is a timing diagram for a cache miss followed by a cache hit.

FIG. 8 is a timing chart showing two consecutive fetch operations with fetch A and fetch B back to back. Fetch A generates a cache miss and fetch B a cache hit. Fetch B can be data already in a slot of the cache, or it could be data contained in the page that was retrieved due to fetch A. Note that fetch B is started at cycle 14. Local store in processor 12 is updated with the data corresponding to fetch A at cycle 15, and is updated with data corresponding to fetch B at cycle 16. Without the inpage buffer of the present invention, fetch B can not even be started until cycle 24, one cycle after the directory is updated for fetch A, and local store would not be updated until cycle 26. A ten cycle gain in performance is achieved with the inpage buffer.

Further performance gain is achieved in the event that all four slots of a congruence class contain a positive bad B bit. Normally, a cache miss would have been generated for each read request for that congruence class. However, with the improved inpage buffer, following the first miss, a fetch request is made to storage 28. The inpage data is then written into the inpage buffer 24 only. It is not stored back into the cache. If the same line or page is being referenced in a later request, the data will be made available to the processor 12 immediately from the inpage buffer 24. If the entire cache is bad, then the inpage buffer acts like a minicache, supplying requested data directly to processor 12 if the requested data is resident therein.

Store operations are not affected by catastrophic errors in the data cache or its directory. For all the processor initiated store operations, the store data is stored into the store buffer, bypassing the cache completely. If the store operation accesses the same line in the inpage buffer, that is absolute address bits 4 to 19 of the translator 34 output and EA bus 18 bits 20 to 25 match absolute address bits 4 to 25 from the inpage buffer control block 64, then the Invalid bit of the inpage buffer 24 in the inpage buffer control block 64 would be reset to 1. Eventually, the modified line is flushed to storage 28. If that line is accessed again, then an inpage operation from storage 28 takes place and the requested line is stored into the inpage buffer.

The inpage buffer control is designed to not hold up the processing of subsequent storage requests. After the eight bytes of data are sent to the processor, the data cache unit 21 is available to process another storage request, while receiving the rest of the inpage data at the same time. The inpage buffer contains the data until all the data is written into the cache arrays. The writing of the arrays from the inpage buffer is allowed to take place only when there is no other storage request. If there is another fetch request to the same page before the data is written to the data cache, the data is accessed from the inpage buffer itself. In this respect the inpage buffer could be looked on as being a separate slot.

Figure 9:
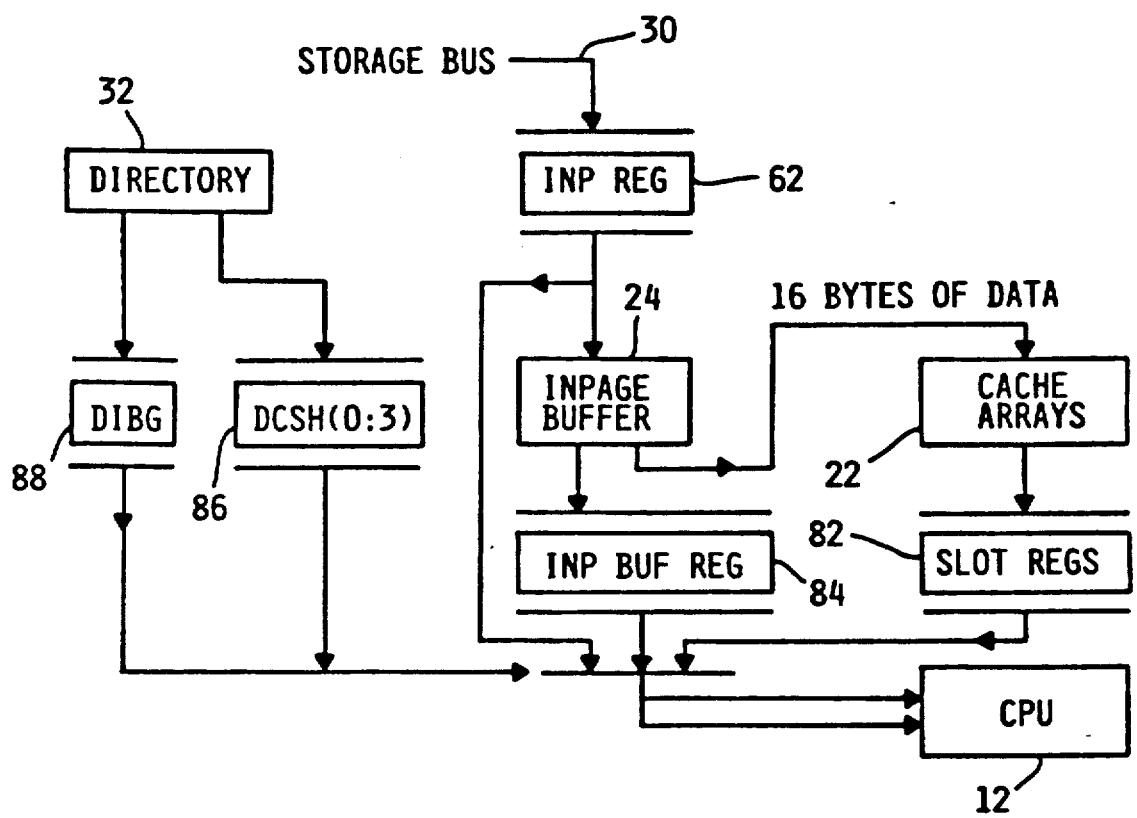
FIG. 9 is a block diagram of the data cache and buffer of FIG. 1.

In FIG. 9, a more detailed block diagram of the data cache unit 21 is shown. Again, the numbering is consistent with FIG. 1. Upon decoding a storage fetch request, data is latched in slot registers 82 and inpage buffer registers 84 at the same time slot. Latches DCSH(0:3) 86 and DIBG 88 are used to select which of the registers 82 and 84 will provide data to processor 12. Only one of the latches should be active, and then select the appropriate register. If the storage request is a cache miss, a 64 byte inpage request is sent to storage 28. The 64 bytes of data is returned eight bytes at a time, starting first with the requested 8 bytes of data on the storage bus. The data is latched up in the inpage register 62, sent to the processor 12 and stored in the inpage buffer 24. The next storage command is then processed while the rest of the 64 bytes is being stored in the inpage buffer. While any storage requests are being decoded, no data from the inpage buffer is stored into the cache 22. If there is a fetch request with a hit to the inpage buffer, the DIBG latch 88 becomes active and the data from the inpage buffer register 84 is selected and sent back to the processor 12. If there is a write operation with a hit to the inpage buffer, then data from the inpage buffer must be written back into the cache arrays before the write operation can be executed. If another fetch request results in a cache miss, the cache arrays are updated with the data in the inpage buffer before the requested data for fetch miss arriving via the storage bus 30. If there is a fetch request that is being inpaged, and there is also an entry for the addressed line in the store buffer, then the cache arrays are updated with the inpaged data immediately and a store buffer merge takes place. This operation is described in more detail in copending patent application for "A Store Buffer Apparatus In A Multiprocessor Computer System". Ser. No. 07/291,805, filed on the same date herewith now abandoned, which is the parent application Ser. No. 07/725,919, assigned to the same assignee as the present application, and hereby incorporated by reference. These above three conditions are the only cases where the cache arrays must get updated immediately. Otherwise the data remains in the inpage buffer until there is a free cycle. Sixteen bytes of data is transferred from the inpage buffer to the cache arrays during one free cycle. A complete line is transferred in four cycles. The worst case for transferring data from the inpage buffer to the cache arrays is when there is no more storage request. In that case, the data can be sent to the cache arrays in eight cycles via the eight byte wide storage bus.

INPAGE BUFFER DETAIL

Figure 10:
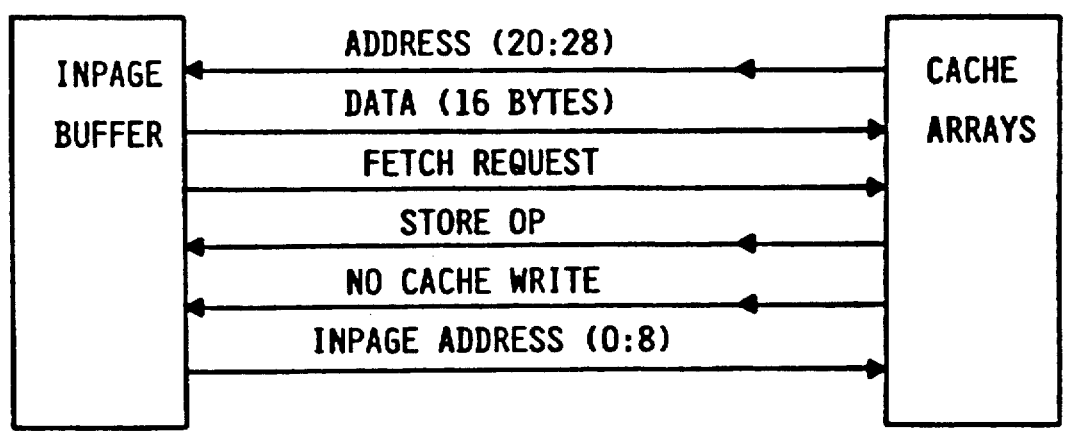
FIG. 10 is a block diagram of the connections between the buffer and data cache.
Figure 11:
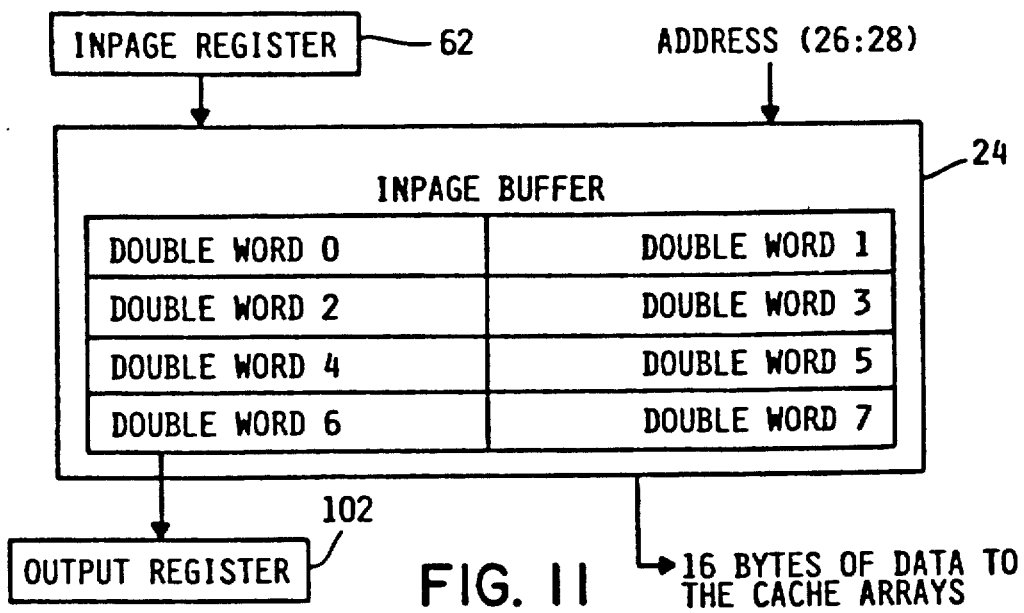
FIG. 11 is a logical layout diagram of the buffer.

With reference to FIG. 10 which shows interconnections between the inpage buffer and cache, and FIG. 11 which shows the logical layout of the inpage buffer, the operation of the inpage buffer is now described in more detail. The inpage buffer 24 consists of 8 double word registers, and the logic which is used to address each register and multiplex the data. This size is chosen as compatible with the page size that is transferred from storage 28. In a further embodiment, the buffer is capable of holding more than one page. In this embodiment, inpage buffer controller 64 must keep track of each of the addresses of the pages.

In FIG. 10, the address is used to address the inpage buffer in order to retrieve data if it is in the buffer. It is also used to determine if there is a cache miss. A 16 byte wide bus is used to transfer the data from the inpage buffer to the cache. An eight byte wide data bus is used to transfer data to the processor 12 when the data from a fetch operation is in the inpage buffer. All fetch and store requests will prevent the data from being written to the cache in the cycles that such request signals are active. A No Cache Write signal is used to prevent data from the inpage buffer being written back into the cache. The No Cache Write signal is active when the directory 32 indicates all four bad bits of the referenced congruence class are on. The inpage address is used to inform the cache array of the address for the data being written.

During fetch operations, there are five latches which get set by the comparator/controller and are used to choose between five different double words. These latches are DCSH(0:3), which represent the four different slots, and DIBG which is used when the requested fetched data is located in the inpage buffer. Only one of these can be active during a fetch operation if the data is located in the cache or inpage buffer. If there is a miss, all five latches will be zero. If all four slots are bad, and we are using the inpage buffer as a minicache, the DIBG latch will be zero and DCSH latches will be set to zeros at the first cycle to indicate a miss and DCSH latches will be set to one at the second cycle to indicate all slots are bad.

Figure 12:
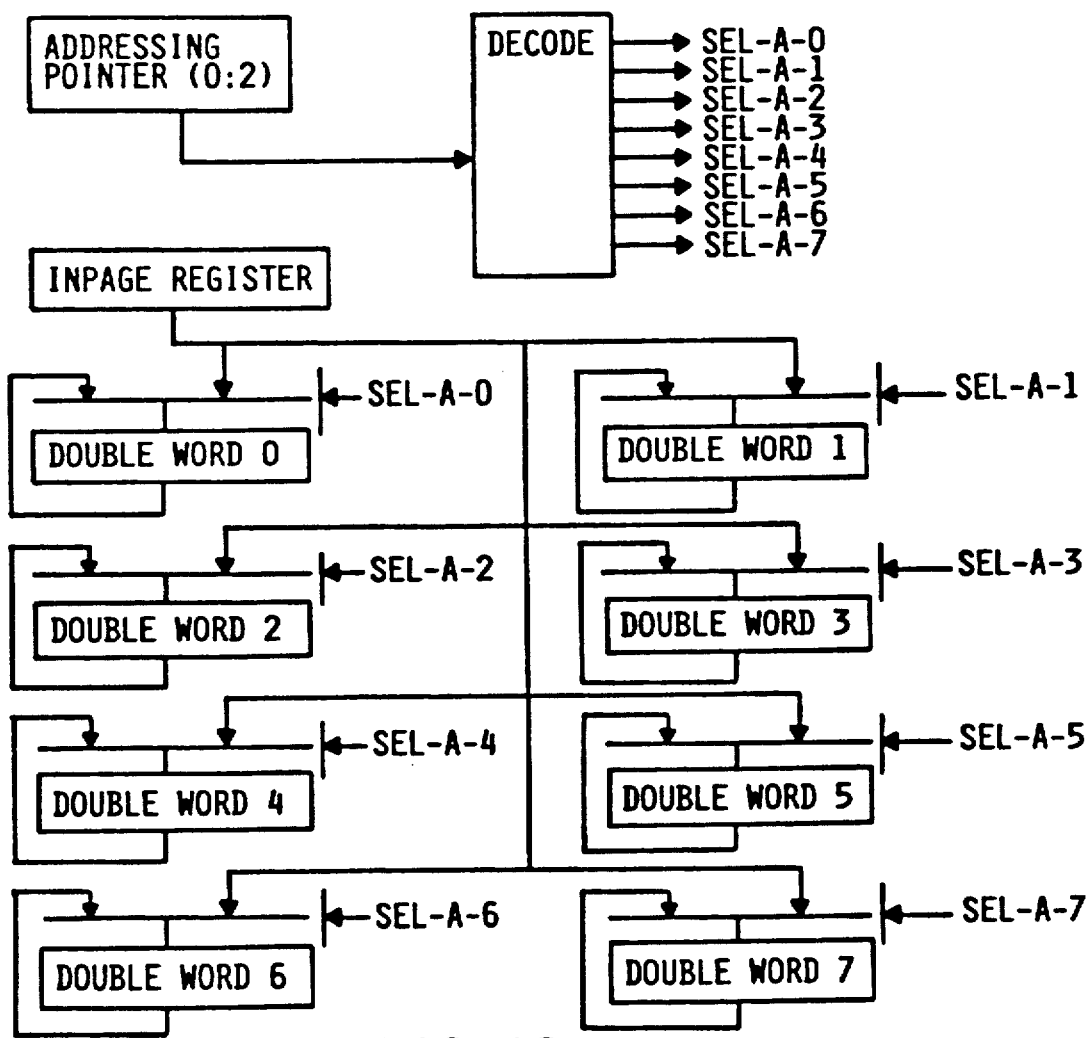
FIG. 12 is a block diagram of the loading of data in the buffer.

Data is put in the inpage buffer, during an inpage, one double word after another. The first double word back from storage is the one the processor requested, and is latched up in the inpage register. The next cycle the following double word is latched up in the inpage register at the same time the first double word is latched up in the proper double word register. The proper register is determined by the address select lines, shown in the FIG. 12 as SEL-A-0-7, which are generated from the addressing pointer. The addressing pointer gets initialized to the value of the address that the processor requested data from. As the data is received, the pointer is adjusted to the next double word that will be latched up. Note that as long as there is a valid inpage data and the pointer is at a given address that double word will be selected and all the rest will feed back on themselves.

The inpage buffer 24 in FIG. 11 consists of eight groups of registers with each group making up 8 bytes of data. These registers are loaded with the data from the inpage register in the proper sequence, so that they match the proper address location. Subsequently, when there are no more storage requests, the data and address are sent to the cache, and the data is stored in the cache array. There is also an eight byte output register 102 which is used to hold the data that is to be sent back to the processor 12.

Figure 13:
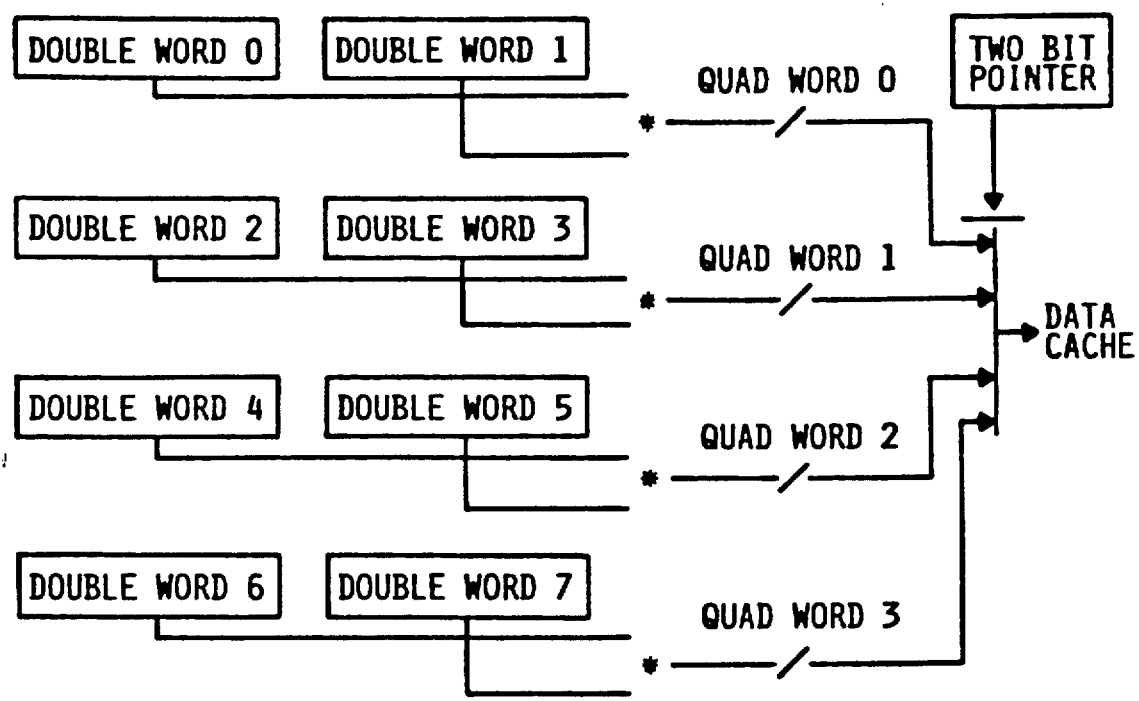
FIG. 13 is a block diagram of the loading of the cache from the buffer.

Data can be accessed from the inpage buffer in three fashions. The first method is a direct access from the inpage register back to the processor. This is allowed for the first double word only. The second method is on every fetch following an inpage, both the cache and the inpage buffer are accessed with the address of the fetch. If the address of the fetch matches on the inpage buffer that double word is sent back to the processor. The last way data is accessed is through a two bit pointer which accesses a given quad word which is sent to the data cache. This may only happen when the data cache is not already servicing a storage request. FIG. 13 illustrates the quad word selection.

The inpage buffer 24 is shown with 8 double word registers and logic which controls the flow of data from the inpage register to the appropriate double word register, and from the appropriate double word register to the output register, or the appropriate quad word to the cache. A three bit pointer in the inpage buffer logic is used to point to the specific double word for sending to the cache. The input register 62 latches the data sent from storage and passes it to the inpage buffer. The input register is also used to send the requested double word to the appropriate processor. The output register 102 is used to hold the data before sending it back to the appropriate processor. If the data for a fetch request is in the inpage buffer, the address is used to choose the proper double word to be placed into the output register.

What is claimed is:

1. A cache bypass apparatus comprising:
   a storage device for storing data;
   a processor generating read storage requests to read data from a corresponding address in said storage device;
   a buffer coupled to said storage device and said processor for receiving data from said storage device and providing the processor with access to said data received from said storage device;
   a cache coupled to said processor and said buffer for receiving data from said buffer and providing the processor with access to said data received from said buffer, said buffer having a smaller capacity than said cache whereby access to said buffer is faster than access to said cache;
   cache controller means, coupled to the processor and the cache, for
     receiving a read storage request from the processor,
     determining if data corresponding to the read storage request is stored in the cache, and
     if said corresponding data is stored in the cache, controlling said cache to copy said data from said cache to the processor bypassing said buffer;
   buffer controller means, coupled to the processor, the cache and the buffer, for
     receiving the read storage request from the processor,
     determining if data corresponding to said read storage request is stored in said buffer or said cache, and
   if said corresponding data is not stored in either said cache or said buffer, copying said data from said storage device to said buffer and then copying said data from said buffer to said processor bypassing said cache,
   if said corresponding data is temporarily stored in the buffer, controlling said buffer to copy said corresponding data from said buffer to the processor bypassing said cache;

receiving another read storage request from the processor for said corresponding data, determining that said corresponding data is stored in said buffer, and controlling said buffer to copy said corresponding data from said buffer to the processor bypassing said cache;

determining if another subsequent read storage request is pending from said processor, and if no other read storage request is pending copying said corresponding data from said buffer to said cache and if another read storage request is pending delaying said copying of said corresponding data from the buffer to the cache until said other request is satisfied.

2. The cache bypass apparatus of claim 1, wherein the cache controller means further comprises a directory having an indication for each piece of data in the cache as to the validity of said each piece.

3. The cache bypass apparatus of claim 2 wherein each piece of data comprises a page of data.

4. The cache bypass apparatus of claim 2 wherein, if the requested data is stored in the cache, the cache controller means copies the data so stored to the processor in response to the directory validity indication corresponding to said data.

5. A method of transferring data from a storage device to a processor in a system having a data buffer coupled to said storage device and said processor, and a cache coupled to said data buffer and said storage device, said buffer having a smaller capacity than said cache, the method comprising the steps of:

a) generating a first read request for data by the processor;

b) checking for the requested data in the cache;

c) checking for the requested data in the buffer;

d) supplying the requested data from the cache to the processor bypassing said buffer if the data is stored in said cache;

e) supplying the requested data from the buffer to the processor bypassing the cache if the data is stored in the buffer;

f) if the data is not stored in either the cache or buffer, sending the request for data to the storage device, copying the requested data from the storage device to the buffer and then copying the requested data from the buffer to the processor bypassing the cache;

g) determining if a second read request, subsequent to said first request is pending from said processor and if said second request is pending, repeating steps a)-f) for said second read request, and delaying copying said data from the buffer to the cache until steps a)-f) are executed, and if said second read request is not pending copying said data from the buffer to the cache.

6. The method of transferring data of claim 5 and further comprising the steps of:

k) detecting bad cache locations;

l) storing indications of bad cache locations in a directory associated with said cache; and m) inhibiting the writing of the data from the buffer into locations of the cache indicated as bad.

* * * * *